United States Patent
Hanna

(12) 
(10) Patent No.: US 6,169,800 B1
(45) Date of Patent: Jan. 2, 2001

(54) INTEGRATED CIRCUIT AMPLIFIER AND METHOD OF ADAPTIVE OFFSET

(75) Inventor: John E. Hanna, Chandler, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 08/887,166

(22) Filed: Jul. 2, 1997

(51) Int. Cl.[7] ................................................. H04M 1/00
(52) U.S. Cl. ............................................. 379/373; 379/252
(58) Field of Search ................................... 379/373, 253, 379/255, 252, 387, 395, 377; 330/199, 250, 252, 261, 296, 285

(56) References Cited

U.S. PATENT DOCUMENTS

| | | | |
|---|---|---|---|
| 4,349,703 | * | 9/1982 | Chea, Jr. ................................ 379/252 |
| 4,585,999 | * | 4/1986 | Hilbert et al. ....................... 330/61 R |
| 4,656,659 | * | 4/1987 | Chea, Jr. ................................ 379/253 |
| 4,771,450 | * | 9/1988 | Castro et al. ........................ 379/386 |

OTHER PUBLICATIONS

"Peak Detector Provides Both The Amplitude And A Peak–event Timing Pulse", E. H. Smith, Jr., Electronic Design, Circle No. 311, Nov. 23, 1977, p. 140.

* cited by examiner

*Primary Examiner*—Wing F. Chan
(74) *Attorney, Agent, or Firm*—Lanny L. Parker

(57) ABSTRACT

Alert amplifier (10) has a peak detector (22) and an operational amplifier (30) that dynamically set a bias voltage of a transducer (32) to minimize the standby current. In the absence of an input ring signal at an input terminal (12), the standby current in the transducer (32) is zero. The bias voltage to the transducer (32) is adjusted from a reference voltage downward in accordance with the input ring signal to minimize the current in the transducer (32) during the activation of the alert amplifier (10).

9 Claims, 1 Drawing Sheet

INTEGRATED CIRCUIT AMPLIFIER AND METHOD OF ADAPTIVE OFFSET

BACKGROUND OF THE INVENTION

The present invention relates, in general, to integrated circuits and, more particularly, to ring detection amplifiers.

In a wireless communications device, such as a cellular phone or a pager, a transducer is activated when an incoming call is received. Prior to the incoming call, the quiescent current in the transducer is minimized to conserve power in the battery operated communications device. When the call is detected in the communications device, the output of a ring detection circuit or an alert detector is biased at about mid supply and a ring signal is transferred to the transducer. The incoming call causes a unidirectional current flow in the transducer that produces an audible ringing. Whether the ring signal is small, producing a quiet ring, or the ring signal is large, producing a loud ring, biasing the output of the alert detector at about mid supply causes significant current in the transducer compared to the standby currents in the wireless communication device.

Accordingly, it would be advantageous to have a ring detection circuit that has a minimal standby current. It would be of further advantage to bias the transducer at a bias reference voltage that minimizes current in the transducer during transfer of the ring signal from the input to the output of the ring detection circuit in the wireless communications device.

DETAILED DESCRIPTION OF THE DRAWINGS

Generally, the present invention uses gain setting circuits and a peak detector circuit to adapt the bias reference voltage of an output transducer to an amplitude of an input ring signal. The bias reference voltage of the output transducer that produces the audible ringing sound is dynamically lowered to a value below the operating voltage of an alert amplifier. The reduction in the bias reference voltage approximately matches the amplitude of the input ring signal in order to minimize the current in the output transducer.

Figure 1:
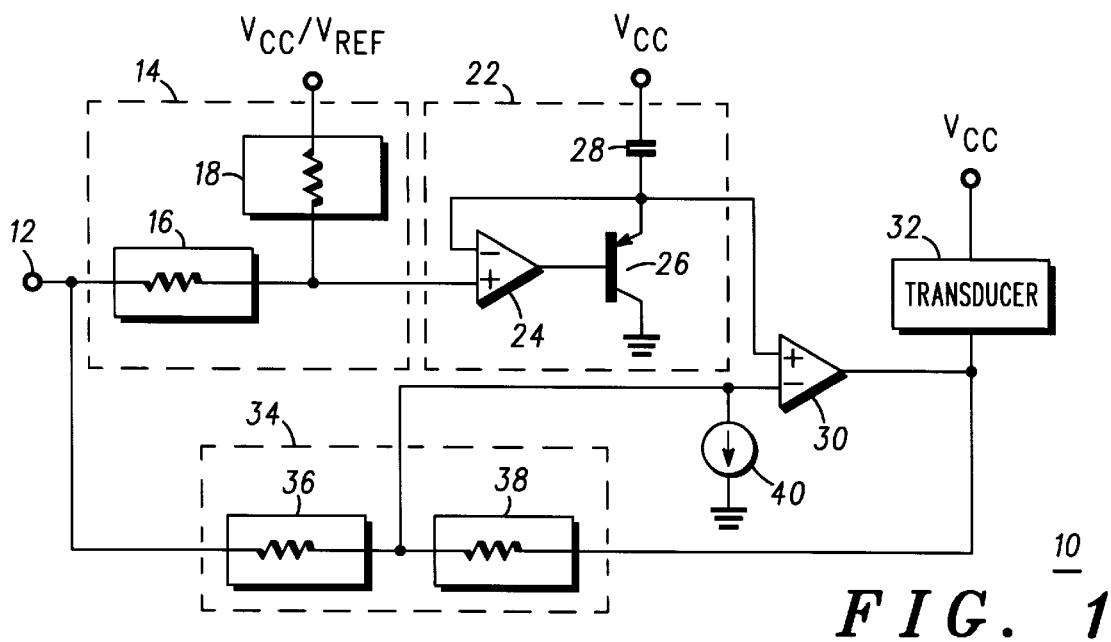
FIG. 1 is a block diagram of an embodiment of an alert amplifier in accordance with the present invention.

FIG. 1 is a block diagram of an alert amplifier 10 in accordance with the present invention. Alert amplifier 10 is an integrated circuit that includes operational amplifiers 24 and 30. The first operational amplifier 24 is a means for amplification that sets a bias reference voltage upon detection of a peak amplitude of an input ring signal. The second operational amplifier 30 is a feedback amplifier that amplifies the input signal being transmitted through alert amplifier 10.

Alert amplifier 10 includes a gain setting circuit 14 having an input terminal connected to terminal 12, a power supply conductor terminal, and an output terminal. Gain setting circuit 14 is a voltage divider circuit or attenuator circuit that includes impedance elements 16 and 18. A first terminal of impedance element 16 is connected to terminal 12 and is coupled for receiving the ring input signal (not shown). A second terminal of impedance element 16 is commonly connected to a first terminal of impedance element 18 and to the non-inverting input of operational amplifier 24. A second terminal of impedance element 18 is connected to the power supply conductor that is coupled for receiving a reference potential such as, for example, $V_{CC}$. Preferably, the second terminal of impedance element 18 is coupled for receiving a reference potential such as, for example, $V_{REF}$, where $V_{REF}$ is a DC component of the input signal at terminal 12.

Alert amplifier 10 further includes a peak detector 22 comprised of operational amplifier 24, a transistor 26, and a capacitor 28. Peak detector 22 is also referred to as a reference circuit. The output of operational amplifier 24 is connected to a base terminal of transistor 26. The collector terminal of transistor 26 is connected to a power supply conductor that is coupled for receiving a reference potential such as, for example, ground. The emitter terminal of transistor 26 is commonly connected to the inverting input of operational amplifier 24, a first terminal of capacitor 28, and to the non-inverting input of operational amplifier 30. In addition, a second terminal of capacitor 28 is connected to the power supply conductor that is coupled for receiving the reference potential such as, for example, $V_{CC}$. By way of example, transistor 26 is a PNP bipolar transistor having a base, a collector, and an emitter. The collector and emitter terminals, and the base terminal, are also referred to as current conduction terminals and a control terminal, respectively. It should be understood that transistor 26 could be a field effect transistor (FET), a metal oxide semiconductor field effect transistor (MOSFET), a bipolar junction transistor (BJT), etc.

In addition, alert amplifier 10 includes a gain setting circuit 34 that has an input terminal connected to terminal 12 of alert amplifier 10, a feedback terminal, and an output terminal. Gain setting circuit 34 is a voltage divider circuit that includes impedance elements 36 and 38. A first terminal of impedance element 36 is connected to terminal 12. A second terminal of impedance element 36 serves as the output terminal of gain setting circuit 34 and is commonly connected to a first terminal of impedance element 38, to the inverting input of operational amplifier 30, and to an input of a current source 40. A second terminal of impedance element 38 serves as the feedback terminal of gain setting circuit 34 and is commonly connected to the output of operational amplifier 30 and to transducer 30. A second terminal of current source 40 is connected to an operating potential such as, for example, ground. Current source 40 sinks a current having a value of $(V_{CC}-V_{REF})/R_{38}$, where $V_{REF}$ is the DC component of the input signal at terminal 12 and $R_{38}$ is the impedance value of impedance element 38. Operational amplifier 30 is also referred to as an amplifier circuit.

In accordance with one embodiment, impedance elements 16 and 18 of gain setting circuit 14 and impedance elements 36 and 38 of gain setting circuit 34 are resistors. In this embodiment, impedance elements 16 and 36 each have resistance values of about 19 kilohms and impedance elements 18 and 38 each have resistance values of about 100 kilohms.

Alert amplifier 10 further includes a transducer 32 having a terminal connected to the output of operational amplifier 30 and a terminal connected to the power supply conductor that is coupled for receiving the reference potential such as, for example, $V_{CC}$. By way of example, transducer 32 is a speaker having an impedance of about 32 ohms. It should be noted that neither the type of transducer nor the impedance of the transducer are limitations of the present invention.

Figure 2:
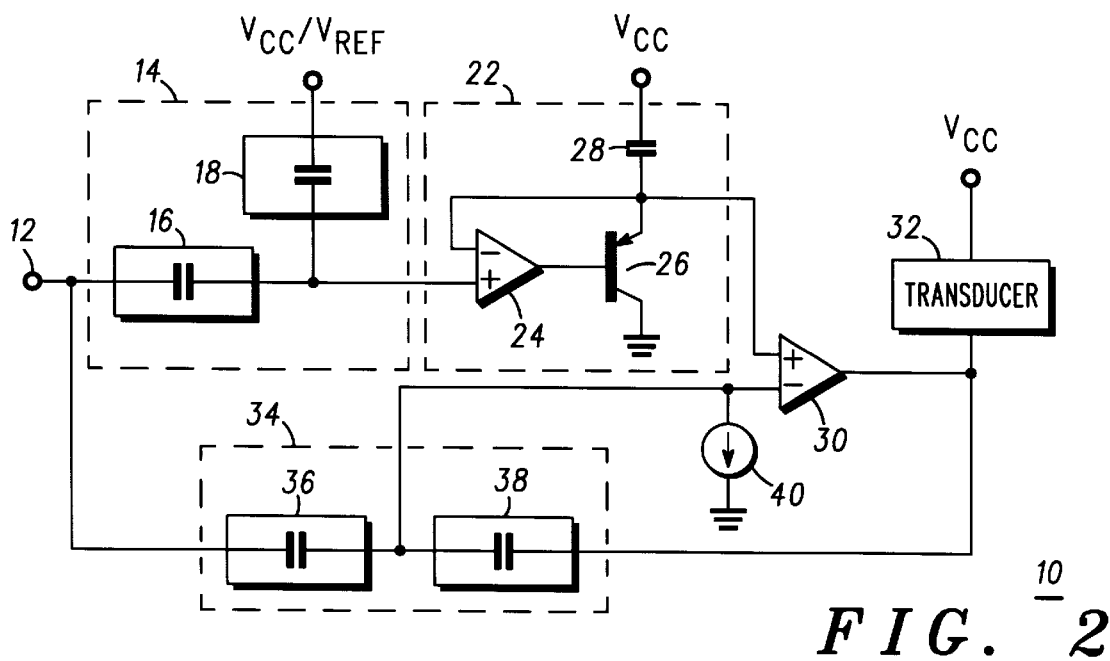
FIG. 2 is a block diagram of an alternate embodiment of an alert amplifier in accordance with the present invention.

FIG. 2 is a block diagram of an alternate embodiment of an alert amplifier in accordance with the present invention. It should be noted that the same reference numbers are used in the figures to denote the same elements. In this alternate embodiment, impedance elements 16, 18, 36, and 38 are capacitors. Alternately, impedance elements 16, 18, 36, and 38 can be inductors, or the like.

Figure 3:
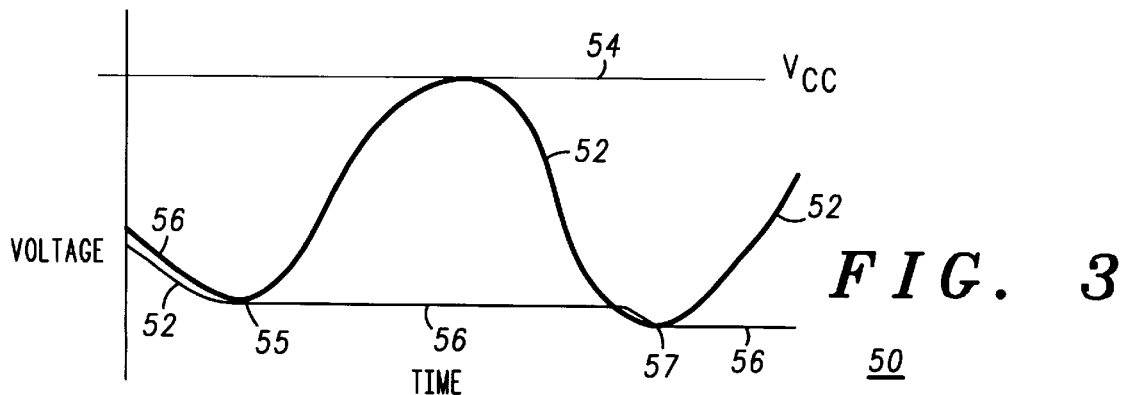
FIG. 3 illustrates a plot of the alert amplifier output in response to an input ring signal in accordance with the present invention.

FIG. 3 illustrates a plot 50 of the output from alert amplifier 10 in response to an input ring signal in accordance with the present invention. For plot 50, the vertical axis represents voltage and the horizontal axis represents time. The amplified output signal of operational amplifier 30 responds to the ring signal received at terminal 12 which is attenuated and represented by waveform 52. The reference potential $V_{CC}$ is indicated by line 54. By way of example, reference potential $V_{CC}$ is supplied by a battery having a value in the range of about 2.8 volts to about 8.0 volts. The output signal of peak detector 22 is a negative peak detection signal represented by waveform 56. In other words, waveform 56 has a voltage value that is less than the reference potential $V_{CC}$ by an amount substantially equal to the signal amplitude of an attenuated ring signal, i.e., the signal at the non-inverting input of operational amplifier 24. The signal amplitude is measured as the difference in voltage levels of the positive peak value and the negative peak value. The time at which a first negative peak occurs in the signal at the non-inverting input of operational amplifier 24 is identified by reference number 55. This is the time at which the signal is furthest away from the reference potential $V_{CC}$. The time at which a second negative peak occurs in the signal at the non-inverting input of operational amplifier 24 is represented by reference number 57.

In operation, alert amplifier 10 adjusts the bias reference voltage for transducer 32 to be (a) proportional to the amplitude of the input ring signal received at terminal 12 and (b) positioned such that the attenuated ring signal swings between a reference potential $V_{CC}$ and the bias reference voltage. The bias reference voltage is the DC voltage component generated at the output of operational amplifier 30. Thus, in accordance with the present invention, the bias reference voltage is dynamically adjusted to minimize the current flowing in transducer 32.

The input signal at terminal 12 is transmitted through impedance element 36 to the inverting input terminal of operational amplifier 30. Further, the input signal is transmitted through gain setting circuit 14 and peak detector 22 to the non-inverting input terminal of operational amplifier 30. Ignoring the effects of gain setting circuit 14 and detector circuit 22, the gain $A_{inv}$ of a signal received at the inverting input of operational amplifier 30 is given by:

$$A_{inv} = -(Z_{38}/Z_{36}),$$

where:

$Z_{38}$ is the impedance value for impedance element 38; and
$Z_{36}$ is the impedance value for impedance element 36.

The gain $A_{non-inv}$ of a signal at the non-inverting input of operational amplifier 30 is given by:

$$A_{non-inv} = (1+Z_{38}/Z_{36}),$$

where:

$Z_{38}$ is the impedance value of impedance element 38; and
$Z_{36}$ is the impedance value of impedance element 36.

In order for the direct current (DC) input voltage received at terminal 12 to produce a common mode signal at the input of operational amplifier 30, the signal transferred along the non-inverting path should be attenuated by an amount given by:

$$Z_{38}/(Z_{36}+Z_{38}).$$

It should be noted that gain setting circuit 14 attenuates the signal received at terminal 12. The amount of attenuation is given by:

$$Z_{18}/(Z_{16}+Z_{18}),$$

where $Z_{16}$ and $Z_{18}$ are the values of impedance elements 16 and 18, respectively.

By matching impedance value $Z_{18}$ to impedance value $Z_{38}$ and impedance value $Z_{16}$ to impedance value $Z_{36}$, the signal transferred along the non-inverting path is properly attenuated.

The voltage at the output of operational amplifier 30 is given by:

$$V_{OUT} = (-A*\sin(\omega t)*Z_{38}/Z_{36}) + A*((Z_{18}/(Z_{16}+Z_{18}))*(1+Z_{38}/Z_{36})),$$

where:

$A*\sin(\omega t)$ is a sine wave input signal having an amplitude A, angular frequency $\omega$, and time t;
$Z_{16}$ is the value of impedance element 16;
$Z_{18}$ is the value of impedance element 18;
$Z_{36}$ is the value of impedance element 36; and
$Z_{38}$ is the value of impedance element 38.

After matching an impedance value of impedance element 18 to that of impedance element 38 and an impedance value of impedance element 16 to that of impedance element 36, the gain of the signal transferred along the non-inverting path of operational amplifier 30 matches the gain of the signal transferred along the inverting signal path.

Referring to FIGS. 1 and 3, peak detector 22 receives an attenuated signal at the non-inverting input of operational amplifier 24. The output of operational amplifier 24 provides an attenuated peak detected signal at the non-inverting input of operational amplifier 30 that represents the voltage level of the negative peak for the attenuated input signal illustrated by reference number 55. Transistor 26 is operating in a conduction mode which causes the voltage at the emitter terminal to differ from the voltage at the output of operational amplifier 24 by an amount approximately equal to the base-to-emitter junction voltage of transistor 26. Capacitor 28 is charged to the voltage level that represents the negative peak for the attenuated input signal.

The attenuated signal at the non-inverting input increases from negative peak 55 toward the voltage $V_{CC}$. As the signal at the non-inverting input continues to increase, the feedback signal from capacitor 28 to the inverting input of operational amplifier 24 causes transistor 26 to be nonconductive. Transistor 26 switches again to a conduction mode when the attenuated signal at the non-inverting input of operational amplifier 24 has a voltage level that is less than the voltage level at the emitter of transistor 26. Reference number 57 illustrates the second negative peak in the amplitude of the attenuated input signal at the non-inverting input of operational amplifier 24. When the signal at the output of operational amplifier 24 has a voltage value that is less than the voltage at the emitter of transistor 26, transistor 26 switches to operate in a conduction mode. In the conduction mode, transistor 26 charges capacitor 28 to a lower voltage level as shown by waveform 56. Thus, peak detector 22 generates an output voltage level that is substantially equal to the level of the negative peak amplitude of the attenuated signal at the non-inverting input of operational amplifier 24.

Although peak detector circuit 22 has been described as a negative peak detector circuit, one skilled in the art could use a positive peak detector circuit for detector circuit 22. It should be understood that the type of detector for detector circuit 22 is not a limitation of the present invention.

It should be noted that in the absence of a signal at terminal 12, the signal at the output of operational amplifier 30 has a value of about $V_{CC}$. It should be further noted that a signal at terminal 12 causes an amplified signal at the output of operational amplifier 30 to swing between the reference voltage $V_{CC}$ and the voltage generated by peak detector 22, i.e., the bias reference voltage transferred to the output of operational amplifier 30. Therefore, the current conducted in transducer 32 is minimized by setting the bias reference voltage of the transducer to dynamically adjust to the amplitude of the input ring signal.

By now it should be appreciated that the present invention provides a peak detector and an operational amplifier for setting the bias voltage of a transducer to minimize the standby current. The bias voltage to the transducer is adjusted from a voltage of $V_{CC}$ downward in accordance with the input ring signal to minimize the current in the transducer during the activation of the alert amplifier. Therefore, the present invention provides a bias to the output transducer such that the transducer conducts zero current in the absence of an input signal and a current that is dependent on the amplitude of the ring signal when an input signal is present.

What is claimed is:

1. A method for setting a bias voltage of a ring signal supplied to a load that is based on an amplitude of an input signal, comprising the steps of:

setting the bias voltage to a reference voltage in the absence of the input signal;

attenuating the input signal to provide an attenuated signal when the input signal is present;

detecting a peak voltage of the attenuated signal for setting a bias voltage that has a value dynamically adjusted to the peak voltage; and generating the ring signal to swing between the bias voltage and the reference voltage.

2. The method of claim 1, wherein the step of detecting a peak voltage further includes the step of detecting a negative peak voltage.

3. The method of claim 2, further including the step of setting the bias voltage below the reference voltage by an amount that is substantially equal to an amplitude of the attenuated signal.

4. A method of setting an amplitude of a ring signal supplied to a load based on a signal, comprising the steps of:

supplying a reference voltage to a terminal of the load and a bias voltage to another terminal of the load;

setting the bias voltage to the reference voltage in the absence of the signal;

detecting a peak voltage of the signal for setting the bias voltage to a value that is dynamically adjusted to the peak voltage when the signal is present; and supplying the ring signal that swings between the bias voltage and the reference voltage to the load.

5. The method of claim 4, wherein the step of detecting the peak voltage further comprising the step of attenuating the signal to provide an attenuated signal and detecting the peak voltage of the attenuated signal.

6. A circuit for setting a voltage across a load based on a signal, comprising:

a first gain setting circuit having an input coupled for receiving the signal and an output for providing an attenuated signal;

a detector circuit having an input coupled for receiving the attenuated signal and an output for providing a negative peak signal;

a second gain setting circuit having a first input coupled for receiving the signal; and an amplifier having a first input coupled to the output of the detector circuit, a second input coupled to an output of the second gain setting circuit, and an output coupled to a second input of the second gain setting circuit and to a terminal of the load for supplying an output signal that swings between the negative peak signal and the reference voltage when the signal is present and is set to the reference voltage in the absence of the signal.

7. The circuit of claim 6, wherein the first gain setting circuit further includes:

a first resistor having a first terminal coupled for receiving the signal; and a second resistor having a first terminal coupled to the second terminal of the first resistor and to the output of the first gain setting circuit, and a second terminal coupled to a first power supply conductor.

8. The circuit of claim 6, wherein the detector circuit further includes:

an amplifier having a first input coupled to the output of the first gain setting circuit;

a transistor having a control terminal coupled to an output of the amplifier, a first conduction terminal coupled to a second input of the amplifier, and a second conduction terminal coupled to a second power conductor; and a capacitor having a first terminal coupled to the first power supply conductor and a second terminal coupled to the second input of the amplifier.

9. The circuit of claim 6, wherein the second gain setting circuit further includes:

a first resistor having a first terminal coupled for receiving the signal; and a second resistor having a first terminal coupled to the second terminal of the first resistor and to the output of the second gain setting circuit, and a second terminal coupled to the second input of the second gain setting circuit.

* * * * *